(12) United States Patent
Zhou et al.

(10) Patent No.: US 10,012,409 B2
(45) Date of Patent: Jul. 3, 2018

(54) MANAGING AIRFLOW DISTRIBUTION THROUGH ADAPTIVE VENT TILES

(71) Applicant: Hewlett Packard Enterprise Development LP, Houston, TX (US)

(72) Inventors: Rongliang Zhou, Palo Alto, CA (US); Cullen E. Bash, Palo Alto, CA (US); Zhikui Wang, Palo Alto, CA (US); Thomas W. Christian, Fort Collins, CO (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 419 days.

(21) Appl. No.: 14/437,677

(22) PCT Filed: Oct. 31, 2012

(86) PCT No.: PCT/US2012/062834
§ 371 (c)(1),
(2) Date: Apr. 22, 2015

(87) PCT Pub. No.: WO2015/171098
PCT Pub. Date: Nov. 12, 2015

(65) Prior Publication Data
US 2016/0040904 A1    Feb. 11, 2016

(51) Int. Cl.
*F24F 13/18* (2006.01)
*G06F 17/18* (2006.01)
(Continued)

(52) U.S. Cl.
CPC ............ *F24F 13/18* (2013.01); *G05B 13/042* (2013.01); *G06F 17/18* (2013.01); *H05K 7/20745* (2013.01); *H05K 7/20836* (2013.01)

(58) Field of Classification Search
CPC ........ F24F 13/18; G05B 13/042; G06F 17/18; H05K 7/20745; H05K 7/20836
See application file for complete search history.

(56) References Cited

U.S. PATENT DOCUMENTS

| 7,313,924 B2 * | 1/2008 | Bash ................ H05K 7/20745 361/692 |
| 7,534,167 B2 | 5/2009 | Day |

(Continued)

FOREIGN PATENT DOCUMENTS

| CN | 101356485 | 1/2009 |
| CN | 102197385 | 9/2011 |
| JP | 20090257617 | 11/2009 |

OTHER PUBLICATIONS

Goren, B., Creating Data Center Efficiencies Using Closed-loop Design, May 20, 2009~http://www.wrightline.com/images/WhitePapers~6 pages.

(Continued)

*Primary Examiner* — Mark Connolly
(74) *Attorney, Agent, or Firm* — Hewlett Packard Enterprise Patent Department

(57) ABSTRACT

In an implementation, a method for managing airflow distribution through a plurality of adaptive vent tiles comprises accessing a model that correlates an environmental condition with a setting arrangement of the plurality of adaptive vent tiles and operational settings of a plurality of fluid moving devices. The method also includes calculating, through implementation of the model, a setting arrangement of the plurality of adaptive vent tiles that results in a substantially optimized metric subject to a set of constraints, wherein the setting arrangement of the plurality of adaptive vent tiles comprises an arrangement in which adaptive vent tiles in respective groups of adaptive vent tiles have substantially uniform opening levels with respect to each other.

18 Claims, 4 Drawing Sheets

(51) Int. Cl.
*G05B 13/04* (2006.01)
*H05K 7/20* (2006.01)

(56) References Cited

U.S. PATENT DOCUMENTS

| | | |
|---|---|---|
| 7,676,280 B1 | 3/2010 | Bash et al. |
| 8,180,494 B2 | 5/2012 | Dawson et al. |
| 8,483,996 B2 * | 7/2013 | Patel .................... F24F 11/001 |
| | | 700/252 |
| 8,914,155 B1 * | 12/2014 | Shah ................. H05K 7/20745 |
| | | 700/19 |
| 2009/0302124 A1 | 12/2009 | Dawson et al. |
| 2010/0256959 A1 | 10/2010 | Vangilder et al. |
| 2011/0106314 A1 | 5/2011 | Beitelmal et al. |
| 2011/0154842 A1 | 6/2011 | Heydari et al. |
| 2012/0158375 A1 | 6/2012 | Healey |

OTHER PUBLICATIONS

Seeber, W. et al., Improving Data Center Energy Efficiency Through Enviornmental Optimization~Oct. 31, 2012~midatlanticinfrared. com~11 pages.
International Searching Authority, The international Search Report and the Written Opinion, dated Feb. 5, 2016. 10 Pages.

* cited by examiner

300

```
┌─────────────────────────────────────────────┐
│  ACCESS A MODEL THAT CORRELATES AN          │
│  ENVIRONMENTAL CONDITION WITH A SETTING     │
│  ARRANGEMENT OF A PLURALITY OF AVTS AND AN  │
│  OPERATIONAL SETTING CONFIGURATION OF A     │
│  PLURALITY OF FMDS                          │
│  302                                        │
└─────────────────────────────────────────────┘
                      │
                      ▼
┌─────────────────────────────────────────────┐
│  DETERMINE PARAMETER VALUES FOR THE MODEL   │
│  304                                        │
└─────────────────────────────────────────────┘
                      │
                      ▼
┌─────────────────────────────────────────────┐
│  CALCULATE, THROUGH IMPLEMENTATION OF THE   │
│  MODEL, A SETTING ARRANGEMENT OF THE AVTS   │
│  THAT RESULTS IN A SUBSTANTIALLY OPTIMIZED  │
│  METRIC SUBJECT TO A SET OF CONSTRAINTS AND │
│  CORRESPONDING TO DETERMINED OPERATIONAL    │
│  SETTINGS OF A PLURALITY OF FLUID MOVING    │
│  DEVICES                                    │
│  306                                        │
└─────────────────────────────────────────────┘
```

FIG. 3

MANAGING AIRFLOW DISTRIBUTION THROUGH ADAPTIVE VENT TILES

BACKGROUND

Data centers typically include multiple cooling units, such as, computer room air conditioning (CRAC) units, arranged to supply cooling airflow to a plurality of servers arranged in rows of racks. The cooling airflow is often supplied through vent tiles distributed at multiple locations on a raised floor. More particularly, the cooling units supply cooling airflow into a plenum formed beneath the raised floor and the cooling airflow is supplied to the servers through the vent tiles.

The cooling units are typically operated to substantially ensure that the temperatures in the servers are maintained within predetermined temperature ranges. That is, to largely prevent the servers from reaching temperature levels at which the servers operate inefficiently or are harmful to the servers, the cooling units are typically operated to supply cooling airflow at lower temperatures and/or at higher volume flow rates than are necessary to maintain the servers within the predetermined temperature ranges. This over-provisioning of cooling resources is inefficient, increases operational costs of the data center, and shortens the life spans of the cooling units.

BRIEF DESCRIPTION OF DRAWINGS

Features of the present disclosure are illustrated by way of example and not limited in the following figure(s), in which like numerals indicate like elements, in which:

FIG. 3 illustrates a flow diagram of a method for managing airflow distribution through adaptive vent tiles, according to an example of the present disclosure;

DETAILED DESCRIPTION

Figure 1:
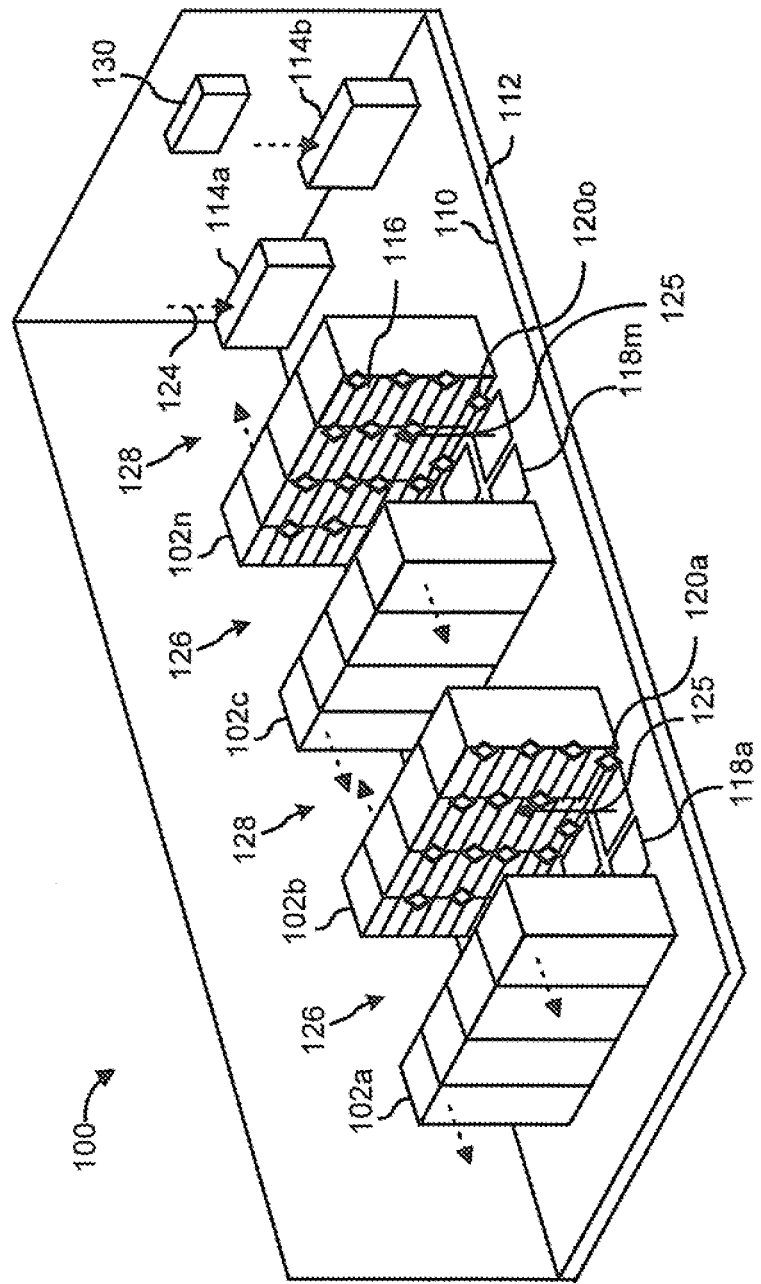
FIG. 1 illustrates a simplified block diagram of a section of an area, in this instance, a data center, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

As used herein, the term "includes" means includes but not limited to, the term "including" means including but not limited to. The term "based on" means based at least in part on. In addition, the variables "l", "m", "n", and "o" are intended to denote integers equal to or greater than one and may denote different values with respect to each other. The terms "setting arrangement" of the adaptive vent tiles (or AVTs) as used herein pertains to the settings, i.e., opening levels, of groups of AVTs. Thus, the setting arrangement of the AVTs identifies both the groupings of the AVTs as well as the opening levels of the AVTs in each of the groupings.

Disclosed herein are example methods and apparatuses for managing airflow distribution and provisioning through a plurality of AVTs. In one example, the airflow distribution is managed through a determination of the settings, e.g., opening levels, of a plurality of AVTs in an area that results in a substantially optimized metric subject to a set of constraints. Particularly, through implementation of a model, a determination may be made as to which of the setting arrangements of the AVTs results in a substantially optimized metric as determined, for instance, through calculation of a constrained metric optimization problem. The metric may comprise a metric that may be written as a function of the AVT and fluid moving device (FMD) actuations, such as any of cooling costs, carbon emissions, sustainability, etc. By way of particular example, the example methods and apparatuses disclosed herein manage airflow distribution through the AVTs to substantially minimize cooling costs. In another example, airflow distribution through the AVTs is managed to substantially minimize carbon emissions and/or maximize sustainability.

According to an example, the AVTs are grouped into a plurality of groups in which opening levels of the AVTs in a first group are substantially uniform with respect to each other, the opening levels of the AVTs in a second group are substantially uniform with respect to each other, etc. By way of particular example, the AVTs are grouped together according to the cold aisles in which the adaptive vent tiles are positioned. That is, the AVTs in a common cold aisle are grouped together. In one regard, by setting the opening levels of the AVTs in a particular group to be substantially the same with respect to each other, determination of the setting arrangement of the AVTs that results in the substantially optimized metric may be determined in a relatively less computationally intensive manner as compared with making this determination without grouping the AVTs into a plurality of groups. In addition, or alternatively, the cold aisles may substantially be separated from hot aisles, i.e., aisles containing no AVTs, through use of barriers, such as curtains, walls, doors, etc., which may further enhance management of the airflow distribution to substantially optimize the metric.

According to an example, the management of the airflow distribution and provisioning may be performed in a two-step optimization manner. The first step may comprise the determination of the setting arrangement of the AVIs and the second step may comprise the determination of the operational settings, e.g., supply air temperature and volume flow rate of airflow, of a plurality of FMDs. In this example, the operational settings of the FMDs that substantially optimize a metric may be determined while maintaining the AVTs at the setting arrangement determined in the first step. In addition, the setting arrangement of the AVTs may be determined less frequently as compared with the operational settings of the fluid moving devices. According to a particular example, the operational settings of the FMDs may be determined as part of a dynamic optimization of cooling resource provisioning, e.g., as thermal conditions in the area change. In this example, the setting arrangements of the AVTs may be determined as other conditions in the area change, such as when a new FMD is added or an existing FMD is moved or removed, new AVTs are installed, a new rack is added or an existing rack is moved or removed, etc.

Through implementation of the example methods and apparatuses disclosed herein, airflow distribution and provisioning may be managed in a manner that substantially optimizes a metric associated with maintaining heat dissipaters within a desired range of temperatures. Alternatively, different metrics may be used for a first operation of determining AVT settings and a second operation of determining FMD settings respectively, such that multiple metrics associated with maintaining heat dissipaters within a desired range of temperatures may substantially be optimized. In addition, the airflow distribution and provisioning may be managed in a relatively computationally efficient manner, while still enabling for substantially real-time detection and handling of thermal anomalies or inefficient airflow statuses.

With reference first to FIG. 1, there is shown a simplified perspective view of a section of an area, in this instance, a data center 100, in which a method and apparatus for managing airflow distribution and provisioning may be implemented, according to an example. Although the area has been depicted as comprising a single room data center 100, it should be clearly understood that the area may comprise other environments, such as multiple rooms in a building, a single non-data center room, multiple buildings, etc. In addition, although particular reference is made herein to airflow distribution and provisioning to a plurality of racks and electronic devices, it should be understood that the airflow may be distributed and provisioned to other types of heat dissipaters, such as humans, electronic equipment not housed in racks, televisions, etc.

The data center 100 is depicted as having a plurality of racks 102a-102n, a plurality of fluid moving devices (FMDs) 114a-114b (the data center 100 may include any number of FMDs 114a-114l), and a plurality of sensors 120a-120o. The racks 102a-102n are depicted as being positioned on a raised floor 110 and as housing electronic devices 116. The electronic devices 116 comprise, for instance, computers, servers, bladed servers, disk drives, displays, etc. As shown in FIG. 1, airflow, such as cool airflow, is delivered through AVTs 118a-118m in the floor 110 to the racks 102a-102n. Although not shown, non-adaptive vent tiles may also be positioned in the floor 110. The FMDs 114a-114l generally operate to supply airflow into a space 112 beneath the raised floor 110, and to cool heated airflow (indicated by the arrows 124) returned into the FMDs 114a-114l, such that the airflow is circulated within the data center 100. In other examples, the FMDs 114a-114l may supply airflow into spaces formed in walls and/or ceilings of a room and the AVTs 118a-118m may be positioned on the walls and/or ceilings.

In any regard, the FMDs 114a-114l may comprise, for instance, air conditioning (AC) units that have actuators for controlling the temperature (e.g., chilled water valve) and the volume flow rate (e.g., variable-frequency drives (VFDs)) of the cooled airflow supplied by the FMDs 114-114l. In other examples, the FMDs 114a-114l comprise heaters having actuators to control the temperature and volume flow rate of heated airflow supplied by the FMDs 114a-114l.

The AVTs 118a-118m comprise automatically adjustable vent tiles that may be individually adjustable, but that may be adjusted in groups for operational policy purposes as discussed in greater detail herein. Alternatively, at least one of the AVTs 118a-118m shown in FIG. 1 may instead comprise manually adjustable vent tiles, e.g., non-adaptive vent tiles. In any regard, the AVTs 118a-118m may be adjusted to vary the volume flow rate of airflow (denoted by the arrows 125) supplied through the AVTs 118a-118m.

When the AVTs 118a-118m comprise automatically adjustable vent tiles, actuators (e.g., motors, fans, etc.) are provided to vary the operational settings of the AVTs 118a-118m. In addition, each of the AVTs 118a-118m may also include an interface through which the AVTs 118a-118m may receive instruction signals from a controller 130. The operational settings of the AVTs 118a-118m may include the opening levels of the AVTs 118a-118m that may be used to vary the volume flow rate of the airflow and, in some instances, a speed level of local fans used to vary the flow rates of the airflow through the AVTs 118a-118m. The AVTs 118a-118m may have many different suitable configurations and are thus not to be limited to any particular type of adaptive vent tile.

As also shown in FIG. 1, the AVTs 118a-118m are depicted as being arranged in some of the aisles formed by the rows of racks 102a-102n, while other aisles do not contain any AVTs 118a-118m. In the present disclosure, the aisles 126 containing the AVTs 118a-118m are defined as cold aisles and the aisles 128 into which heated airflow from the electronic devices 116 flows are defined as hot aisles. The aisles 126, 128 may also be defined in various manners. For instance, a cold aisle 126 or a hot aisle 128 may be defined as an aisle that extends between gaps, such as walkways, between adjacent rows of racks 102a-102n. In this example, cold aisles 126 and hot aisles 128 may be formed between rows of racks 102a-102n that are separated by walkways. As another example, a cold aisle 126 or a hot aisle 128 may be defined as an aisle that extends between a pair of opposing walls in a data center 100, regardless of any walkways positioned between the rows of racks 102a-102n, as well as any lengths of aisles therebetween. Although not shown, the cold aisles 126 may be further separated from the hot aisles 128 through use of barriers, such as curtains, doors, walls, etc., for instance, positioned adjacent to the ends of the rows of racks 102a-102n and/or above the aisles. According to an example, the barriers may be used for respective contained environments in which the cold aisles 126 are substantially separated from the hot aisles 128 other than through the racks 102a-102n.

According to an example, the AVTs 118a-118m are arranged into a plurality of groups, in which each of the AVTs 118a-118m in a particular group have the same setting. That is, all of the AVTs 118a-118m in one group are set to have substantially the same opening levels By way of particular example, the opening levels among the AVTs 118a-118m in a particular group may differ from each other by less than about ±2%. The AVTs 118a-118m may be arranged into the plurality of groups in any suitable manner. For instance, the grouping of the AVTs 118a-118m may be determined based upon the geographic proximities of the AVTs 118a-118m with respect to each other. That is, the AVTs 118a-118m that are in the closest geographic proximity with respect to each other may be grouped together into one group because these AVTs 118a-118m are likely to have similar influences on the same sets of electronic devices 116. For instance, all of the AVTs 118a-118m in one cold aisle 126 may be arranged into a first group, all of the AVTs 118a-118m in another cold aisle 126 may be arranged into a second group, etc. As another example, the AVTs 118a-118m in the same cold aisle 126 may be arranged into different groups with respect to each other.

The arrangement of the AVTs 118a-118m into the plurality of groups, in which the AVTs 118a-118m in each particular group has substantially the same opening level, generally reduces the complexity of a model that describes airflow transport and distribution within an area, such as the data center 100. For instance, when the AVTs 118a-118m are construed separately, a physics-based and discretized dynamic temperature model at a specific rack inlet is described by the following equation:

$$T(k+1) = T(k) + \left\{ \sum_{i=1}^{N_{FMD}} g_i \cdot [SAT_i(k) - T(k)] \cdot VFD_i(k) \right\} \cdot \left\{ \sum_{j=1}^{N_{tile}} b_j \cdot U_j(k) \right\} + C$$  Equation (1)

In Equation (1), T represents a rack inlet temperature, k and k+1 represent discrete time steps, $SAT_i$ and $VFD_i$ respectively are a supply air temperature and a blower speed of the ith FMD, $U_j$ is the opening of the jth AVT, $N_{FMD}$ and $N_{tile}$ are respectively the total number of FMDs 114a-114l and the total number of AVTs 118a-118m, and $g_i$ and $b_j$ are the parameters that capture influences of each FMD i and AVT j on the specific rack inlet, respectively, and C denotes a temperature change caused by factors other than by the FMDs.

However, when the AVTs 118a-118m in each of the groups of AVTs have substantially uniform opening levels, the model in Equation (1) may be simplified to $$T(k+1) = T(k) + \left\{ \sum_{i=1}^{N_{FMD}} g_i \cdot [SAT_i(k) - T(k)] \cdot VFD_i(k) \right\} \cdot \left\{ \sum_{j=1}^{N_{VTG}} d_j \cdot U_j(k) + U_0 \right\} + C.$$  Equation (2)

In Equation (2), $N_{VTG}$ comprises the total number of AVT groups, $U_j(k)$ is the substantially uniform AVT opening of the $j^{th}$ AVT group at sampling interval k, $d_j$ is a parameter that captures the influence of each of the AVT groups j, and $U_0$ quantifies the aggregated effects of all other vent tiles except the AVTs 118a-118m. In other words, $U_0$ quantifies the aggregated effects of non-adaptive vent tiles. Accordingly, if the data center 100 contains no non-adaptive vent tiles, the value of $U_0$ is zero. In Equation (1), each AVT 118a-118m may have a different setting, and thus, there is one parameter $b_i$ for each of the AVTs 118a-118m. In contrast, because the AVTs 118a-118m are grouped and the opening levels of the AVTs 118a-118m in the same groups are substantially uniform with respect to each other, the total number of parameters $d_i$ may be substantially lower in Equation (2) as compared with that of $b_i$ in Equation (1).

Generally speaking, therefore, as compared with Equation (1), the model parameters of Equation (2) for each rack inlet temperature decreases to $N_{FMD}+N_{VTG}+2$. As discussed in greater detail herein below, a model identification technique may be conducted to determine the setting arrangement of the AVTs 118a-118m that results in a substantially optimized metric associated with cooling heat dissipaters. In addition, the operational settings of the FMDs 114a-114l that substantially optimize the same or a different metric associated with cooling the heat dissipaters may also be determined.

In any regard, the airflow contained in the space 112 may include airflow supplied by more than one of the FMDs 114a-114l. Thus, characteristics of the airflow, such as, temperature, pressure, humidity, flow rate, etc., delivered to various locations in the data center 100 may substantially be affected by the operations of multiples ones of the FMDs 114a-114l. As such, conditions at various locations in the data center 100 may substantially be affected by the operations of more than one of the FMDs 114a-114l.

The sensors 120a-120o may be networked, in a wired and/or wireless manner, with the controller 130 to convey detected condition information to the controller 130. The detected conditions may include, for instance, temperatures at the inlets of the racks 102a-102n, temperatures at the outlets of the adaptive vent tiles 118, etc. The detected conditions may, in addition or alternatively, include other environmental conditions, such as, pressure, humidity, airflow velocity, etc. In this regard, the sensors 120a-120o comprise any suitable types of sensors to detect the conditions.

As discussed in greater detail herein below, environmental condition information collected by the sensors 120a-120o is used to determine various parameters of a model that describes airflow transport and distribution within the area. In one example, the model comprises a physics based state-space model. As also discussed in greater detail herein below, the model further describes effects of actuations on the FMDs 114a-114l as well as the setting arrangements of the AVTs 118a-118m on the airflow transport and distribution within the area. In this regard, the model disclosed herein is a holistic model. Moreover, the model may be implemented in the management of airflow provisioning in the data center 100.

In one example, values obtained through implementation of the model are used to determine setting arrangements for the groups of AVTs 118a-118m that result in a substantially optimized metric associated with maintaining heat dissipaters substantially within a predetermined temperature range. In another example, the obtained values are used to determine settings, e.g., supply air temperatures (SATs) and variable-frequency drive (VFD) settings, for the FMDs 114a-114l that result in a substantially optimized metric associated with maintaining heat dissipaters substantially within a predetermined temperature range. Various manners in which management of airflow distribution and provisioning through a plurality of AVTs 118a-118m with respect to these examples are described in detail below.

It should be understood that the data center 100 may include additional elements and that some of the elements described herein may be removed and/or modified without departing from a scope of the data center 100. In addition, the data center 100 may comprise a data center that is in a fixed location, such as a building, and/or a data center that is in a movable structure, such as a shipping container or other relatively large movable structure. Moreover, although particular reference has been made in the description of the area as comprising a data center, it should be understood that the area may comprise other types of structures, such as, a conventional room in building, an entire building, etc.

Although the controller 130 is illustrated in FIG. 1 as comprising an element separate from the electronic devices 116, the controller 130 may comprise or be integrated with an electronic device 116 without departing from a scope of the data center 100 disclosed herein. In addition, or alternatively, the controller 130 may comprise a set of machine readable instructions to operate on a computing device, for instance, one of the electronic devices 116 or a different computing device. Moreover, although a single controller 130 has been depicted in FIG. 1, a plurality of controllers 130 may be implemented to respectively control individual ones or groups of FMDs 114a-114l and, in further examples, individual ones or groups of AVTs 118a-118m.

Figure 2:
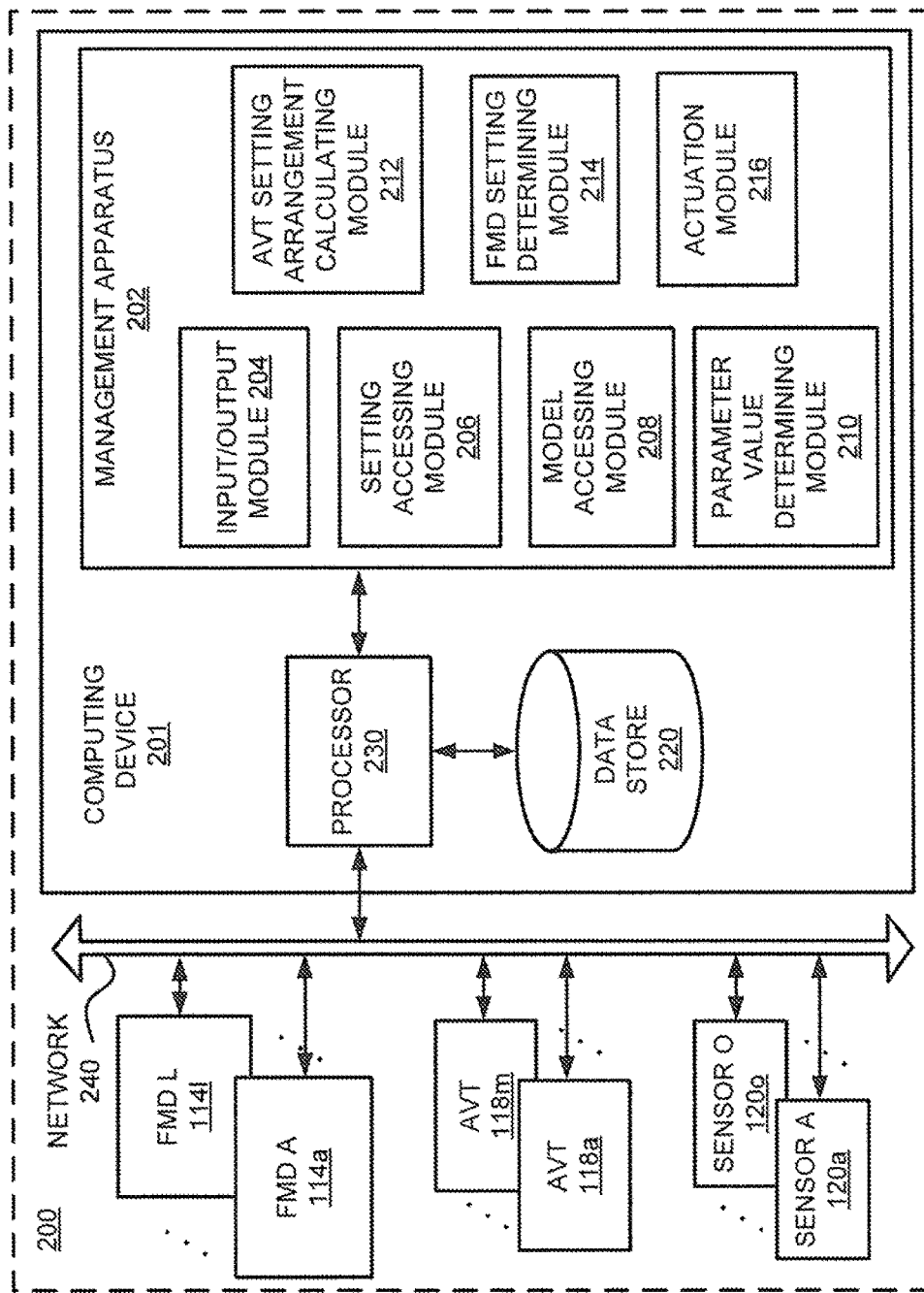
FIG. 2 shows a block diagram of a system for managing airflow distribution and provisioning in an area, according to an example of the present disclosure.

Turning now to FIG. 2, there is shown a block diagram of a system 200 for managing airflow distribution and provisioning in an area, according to an example. It should be understood that the system 200 may include additional components and that some of the components described herein may be removed and/or modified without departing from the scope of the system 200. For instance, the system 200 may include any number of sensors 120a-120o, memories, processors, fluid moving devices 114a-114l, AVTs 118a-118m, as well as other components, which may be implemented in the operations of the system 200. In addition, although the computing device 201 is depicted as being in communication with the FMDs 114a-114l, the AVTs 118a-118m, and the sensors 120a-120n through the network 240, the computing device 201 may not be in communication with the FMDs 114a-114l, the AVTs 118a-118m, and the sensors 120a-120n without departing from a scope of the system 200.

As shown, the system 200 includes the FMDs 114a-114l, the AVTs 118a-118m, the sensors 120a-120o, the computing device 201, and the network 240. The network 240 generally represents a wired or wireless structure in the area for the transmission of data and/or signals between the various components of the system 200. The computing device 201 is also depicted as including a management apparatus 202, a data store 220, and a processor 230. The management apparatus 202 is further depicted as including an input/output module 204, a setting accessing module 206, a model accessing module 208, a parameter value determining module 210, an AVT setting arrangement calculating module 212, a FMD setting determining module 214, and an actuation module 216. It should be understood that one or more of the modules 204-216 may be removed and/or modified without departing from a scope of the management apparatus 202.

The management apparatus 202 may comprise a volatile or non-volatile memory, such as DRAM, EEPROM, MRAM, flash memory, floppy disk, a CD-ROM, a DVD-ROM, or other optical or magnetic media, and the like, on which is stored machine readable instructions, in this example, the modules 204-216 comprise modules of machine readable instructions stored in the volatile or non-volatile memory, which are executable by the processor 230. According to another example, the management apparatus 202 comprises a hardware device, such as, a circuit or multiple circuits arranged on a board. In this example, the modules 204-216 comprise circuit components or individual circuits, which the processor 230 is to control. According to a further example, the management apparatus 202 comprises a combination of modules with machine readable instructions and hardware components.

The processor 230 is to receive detected condition information from the sensors 120a-120o over the network 240, from a repository that collects the detected condition information, etc. In any regard, the processor 230 may store the condition information detected by the sensors 120a-120o in the data store 220, which may comprise any suitable memory upon which the processor 230 may store data and from which the processor 230 may retrieve data. The data store 220 may comprise DRAM, EEPROM, MRAM, flash memory, floppy disk, a CD-ROM, a DVD-ROM, or other optical or magnetic media, and the like. Although the data store 220 has been depicted as being a separate component from the management apparatus 202, it should be understood that the data store 220 may be integrated with the management apparatus 202 without departing from a scope of the system 200.

According to an example, some or all of the modules 204-216 of the management apparatus 202 are implemented to determine which setting arrangement of a plurality of setting arrangements of the AVTs 118a-118m results in a substantially optimized metric associated with cooling heat dissipaters, such as the electronic devices 116 in an area, humans in a conference room, etc. The management apparatus 202 may output the determined setting arrangement, e.g., the respective opening levels for the groups of AVTs 118a-118m, through the input/output module 204. The output may comprise a display of the determined setting arrangement on a display monitor, which a user may consult in setting the opening levels of the groups of AVTs 118a-118m. In addition or alternatively, in instances in which the management apparatus 202 has control over the AVTs 118a-118m, the output may comprise instruction signals communicated to actuators or controllers of the AVTs 118a-118m over the network 240.

Some or all of the modules 204-216 of the management apparatus 202 may also be implemented to determine operational settings for the FMDs 114a-114l that result in a substantially optimized metric associated with cooling the heat dissipaters. According to an example, the operational settings for the FMDs 114a-114l are determined while substantially maintaining the AVTs 118a-118m at a previously determined setting arrangement. Thus, for instance, the operational settings for the FMDs 114a-114l may be varied to compensate for changing environmental conditions in the area, while the setting arrangement for the groups of AVTs 118a-118m may be varied as other conditions change in the area, e.g., addition/removal/movement of a FMD, addition/removal/movement of racks, addition of AVTs, etc. In one example, the setting arrangement for the AVTs 118a-118m is based on the predicted steady-state conditions of the environmental conditions in the area, while the operational settings for the FMDs 114a-114l are determined under substantially real time, e.g., dynamically changing, environmental conditions. The operational settings for the FMDs 114a-114l may thus be determined at a higher granularity level than the setting arrangements of the AVTs 118a-118m. In addition, the operational settings may be determined for each of the FMDs 114a-114l, such that the operational settings need not be uniform across the FMDs 114a-114l.

The management apparatus 202 may output, for instance, through the input/output module 204, the determined operational settings for the FMDs 114a-114l, which may comprise the volume flow rate set points and/or supply temperature set points of the FMDs 114a-114l. The output may comprise a display of the determined operational settings for the FMDs 114a-114l on a display monitor, which a user may consult in setting the operational settings of the FMDs 114a-114l. In addition or alternatively, in instances in which the management apparatus 202 has control over the FMDs 114a-114l, the output may comprise instruction signals communicated to actuators or controllers of the FMDs 114a-114l over the network 240.

Figure 4:
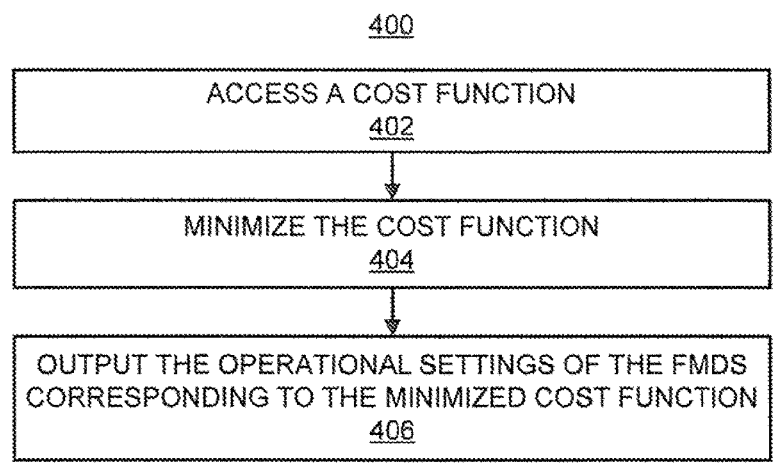
FIG. 4 depicts a flow diagram of a method of implementing a model in managing airflow provisioning, according to an example of the present disclosure.

Various manners in which the modules 204-216 of the management apparatus 202 may operate are discussed with respect to the methods 300 and 400 depicted in FIGS. 3 and 4. It should be readily apparent that the methods 300 and 400 respectively depicted in FIGS. 3 and 4 represent generalized illustrations and that other elements may be added or existing elements may be removed, modified or rearranged without departing from the scopes of the methods 300 and 400.

With reference first to FIG. 3, there is shown a flow diagram of a method 300 for managing airflow distribution through a plurality of AVTs 118a-118m, according to an example. In a particular example, the method 300 may be implemented in an area that includes a plurality of racks 102a-102n and in which a plurality of FMDs 114a-114l are to supply airflow to the racks 102a-102n through a plurality of AVTs 118a-118m. In other examples, the method 300 may be implemented in other types of areas in which airflow is to be supplied through AVTs 118a-118m.

At block 302, a model that correlates an environmental condition, such as temperature, with a setting arrangement of a plurality of AVTs 118a-118m and operational settings of a plurality of FMDs 114a-114l is accessed, for instance, by the model accessing module 208. The model may be stored in the data store 220 and may thus be accessed from the data store 220. According to an example, the model comprises Equation (2), which is reproduced below.

$$T(k+1) = T(k) + \left\{ \sum_{i=1}^{N_{FMD}} g_i \cdot [SAT_i(k) - T(k)] \cdot VFD_i(k) \right\} \cdot \left\{ \sum_{j=1}^{N_{VTG}} d_j \cdot U_j(k) + U_0 \right\} + C.$$

Equation (2)

A steady-state version of model in Equation (2) is denoted below as Equation (3). The steady-state condition in an area may comprise a condition in which the FMDs 114a-114l are maintained at constant settings and the AVTs 118a-118m are set at a constant arrangement. Particularly, the steady-state rack inlet temperature $T_{ss}$ solved from Equation (2) is:

$$T_{ss} = \frac{\frac{C}{\bar{U}} + \sum_{i=1}^{N_{FMD}} g_i \cdot SAT_i \cdot VFD_i}{\sum_{i=1}^{N_{FMD}} g_i \cdot VFD_i}.$$

Equation (3)

In Equation (3), C denotes a temperature change caused by factors other than by the FMDs (e.g., as caused by recirculation in the area), $\bar{U}$ comprises the setting arrangement of the AVTs 118a-118m, in which the AVTs 118a-118m are arranged into respective groups as discussed herein, $g_i$ is a parameter that captures influences of each FMD i, $SAT_i$ and $VFD_i$ are a supply air temperature and a blower speed of the ith FMD, respectively, and $N_{FMD}$ denotes a total number of FMDs 114a-114l. In addition, $\bar{U}=\Sigma_{j=1}^{N_{VTG}} d_j \cdot U_j + U_0$, in which $N_{VTG}$ is the total number of AVT groups, $U_j$ is the substantially uniform AVT opening of the $j^{th}$ AVT group, $d_j$ is a parameter that captures the influence of each of the AVT groups j, and $U_0$ quantifies the aggregated effects of all other vent tiles except the AVTs 118a-118m.

At block 304, parameter values for the parameters in the model may be determined, for instance, by the parameter value determining module 210. According to an example, values for the parameters defined by Equations (2) and (3) may be determined through an analysis of the condition data detected by the sensors 120a-120o. More particularly, the values for the parameters $g_i$, $d_j$, $U_0$, and C in Equation (2) may be determined through an optimization process, in which the parameters $g_i$, $d_j$, $U_0$, and C comprise respective values that minimize the difference between the thermal status (rack inlet temperatures) predicted by the model (Equation (2)) using the parameters ($g_i$, $d_j$, $U_0$, and C) being evaluated and the detected conditions. The parameters ($g_i$, $d_j$, $U_0$, and C) that result in the least amount of difference between the thermal status (rack inlet temperatures) predicted by the model and the detected conditions may be selected as the values for the parameters ($g_i$, $d_j$, $U_0$, and C). This optimization process may be repeated for each rack inlet temperature since each rack inlet temperature is characterized by a different set of parameters. Alternatively, the parameter optimization process for a plurality of different rack inlet temperatures may be performed in parallel.

It should be understood that the model accessed at block 302 may comprise either of the models denoted by Equations (2) and (3). In instances in which the model denoted by Equation (3) is accessed at block 302, the determination of the values for the parameters may have been determined by solving for the parameter values in Equation (2). According to an example, once the parameter values of the model have been determined at block 304, block 304 may be omitted in future iterations of the method 300. However, block 304 may be repeated in instances where relatively significant changes are made in the area.

At block 306, through implementation of the model, a setting arrangement of the plurality of AVTs 118a-118m that results in a substantially optimized metric subject to a set of constraints is calculated, for instance, by the AVT setting arrangement calculating module 214. As discussed above, the setting arrangement of the plurality of AVTs 118a-118m comprises an arrangement in which AVTs 118a-118m in respective groups of AVTs have substantially uniform opening levels with respect to each other. That is, the setting arrangement determined at block 306 results in the AVTs in a first group having opening levels that are substantially uniform with respect to each other and the AVTs in a second group having opening levels that are substantially uniform with respect to each other, in which the opening levels of the AVTs in the first group may differ from the opening levels of the AVTs in the second group.

According to an example, the model represented by Equation (3) is implemented at block 306 to calculate the setting arrangement of the AVTs 118a-118m. In this example, for each of a plurality of AVT group setting arrangements $\bar{U}=[U_1 \ U_2 \ \ldots \ U_{N_{VTG}}]$, a minimized cost function $J^*(\bar{U})$ is evaluated by solving the following equation:

$$J*(\bar{U}) = \text{minimize} J(\overline{VFD}, \overline{SAT}) = \left\{ \sum_{i=1}^{N_{FMD}} VFD_i^3 \right\} R_{VFD} + \left\{ \sum_{i=1}^{N_{FMD}} (SAT_{max} - SAT_i) \right\} R_{SAT}.$$

Equation (4)

In Equation (4), $\overline{VFD}=[VFD_1 \ VFD_2 \ \ldots \ VFD_{N_{FMD}}]$, $\overline{SAT}=[SAT_1 \ SAT_2 \ \ldots \ SAT_{N_{FMD}}]$, $R_{VFD}$ and $R_{SAT}$ respectively are proper weightings for VFD power and chiller power, and $SAT_{max}$ is the maximum allowable supply air temperature of the FMDs 114a-114l. According to an example, Equation (4) may be solved as an optimization problem subject to a set of constraints in order to determine operational settings for the FMDs 114a-114l that substantially minimize the costs associated with cooling the electronic devices 116 when the AVTs 118a-118m have the setting arrangement as accessed at block 402.

The set of constraints may comprise, for instance:

$\overline{VFD}_{min} \leq \overline{VFD} \leq \overline{VFD}_{max}$, $\overline{SAT}_{min} \leq \overline{SAT} \leq \overline{SAT}_{max}$, and $T_{ss} \leq T_{ref}$.

In the set of constraints above, $T_{ref}$ is the temperature thresholds at all of the inlets of the racks 102a-102n of interest, $\overline{VFD}_{min}$ the minimum allowable speeds of the VFDs in the FMDs 114a-114l, $\overline{SAT}_{min}$ is the minimum allowable supply air temperatures of the FMDs 114a-114l, and $T_{ss}$ is solved from Equation (3) with AVT settings defined by $\overline{U}$. In addition, the optimal setting arrangement of the AVTs 118a-118m $\overline{U}^*$ that leads to the global minimized cooling cost at steady-state may further be found from the following optimization problem:

$$\text{minimize } J^*(\overline{U}), \text{ subject to } \overline{U}_{min} \leq \overline{U} \leq \overline{U}_{max}. \quad \text{Equation (5)}$$

In Equation (5), $\overline{U}_{min}$ is the minimum allowable opening levels of the AVTs 118a-118m and $\overline{U}_{max}$ is the maximum allowable opening levels of the AVTs 118a-118m. That is, the setting arrangement of the AVTs 118a-118m that results in the substantially optimized metric comprises the setting arrangement ($\overline{U}$) corresponding to the minimized cost function $J^*(\overline{U})$ determined through solving Equation (5).

The setting arrangement of the AVTs 118a-118m that corresponds to the substantially optimized metric may be outputted, for instance, by the input/output module 204. The setting arrangement may be outputted by the input/output module 204 in any of the manners discussed above.

Turning now to FIG. 4, there is shown a flow diagram of a method 400 of implementing a model in managing airflow provisioning in an area, according to an example. As shown therein, at block 402, a cost function is accessed, for instance, by the FMD setting determining module 214. The cost function may comprise a total airflow provisioning power consumption and is defined with respect to the airflow provisioning actuations available in the area. The available airflow provisioning actuations in the data center 100 comprise temperature and volume flow rate of airflow supplied by the fluid moving devices 114a-114l. According to an example, the cost function comprises:

$$J(\overline{VFD}, \overline{SAT}) = \left\{ \sum_{l=1}^{N_{FMD}} VFD_l^3 \right\} R_{VFD} + \left\{ \sum_{l=1}^{N_{FMD}} (SAT_{max} - SAT_l) \right\} R_{SAT}. \quad \text{Equation (6)}$$

The terms in Equation (6) are defined above with respect to Equation (4).

At block 404, the cost function is minimized, for instance, by the FMD setting module 216 to determine settings, i.e., VFDs and SATs, of the FMDs 114a-114l that substantially optimize a metric, such as cooling cost, carbon emission, etc., associated with cooling heat dissipaters. At block 404, according to an example, the cost function may be minimized subject to a set of constraints, such as, the set of constraints discussed above, with the exception of the steady-state temperature constraint $T_{ss} \leq T_{ref}$. Instead, the cost function is subject to a real-time temperature evolution constraint:

$T(k+s) \leq T_{ref}$, for $1 \leq s \leq N$, in which k, s, and N are all integers, k is the current control interval, and N is the desired number of steps' prediction starting from the current control interval. In addition, T(k+s) is evaluated using Equation (2) with FMD setting being evaluated and the outputted AVT settings calculated from method 300 in FIG. 3. In one regard, the opening levels of the AVTs 118a-118m may affect the optimal solution for the FMD settings under real-time conditions.

Minimization of the cost function may thus comprise a constrained optimization problem, in which the solution to the constrained optimization problem are the operational settings, i.e., VFD and SAT set points, of the FMDs 114a-114l. In addition, at block 406, the operational settings of the FMDs 114a-114l corresponding to the minimized cost function may be outputted. The operational settings may be outputted by the input/output module 204 in any of the manners discussed above.

According to an example, the method 300 may be performed at a coarser granularity as compared with the method 400. Thus, for instance, the setting arrangements of the AVTs 118a-118m may be determined less frequently as compared with the operational settings of the FMDs 114a-114l. According to a particular example, the method 400 may be implemented as part of a dynamic optimization of cooling resource provisioning, e.g., as thermal conditions in the area change. In addition, the method 300 may be implemented as other conditions in the area change, such as when a new FMD is added or an existing FMD is moved or removed, new AVTs are installed, a new rack is added or an existing rack is moved or removed, etc.

Some or all of the operations set forth in the methods 300 and 400 may be contained as utilities, programs, or subprograms, in any desired computer accessible medium. In addition, the methods 300 and 400 may be embodied by computer programs, which can exist in a variety of forms both active and inactive. For example, they may exist as software program(s) comprised of program instructions in source code, object code, executable code or other formats. Any of the above may be embodied on a computer readable storage medium.

Example computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 5:
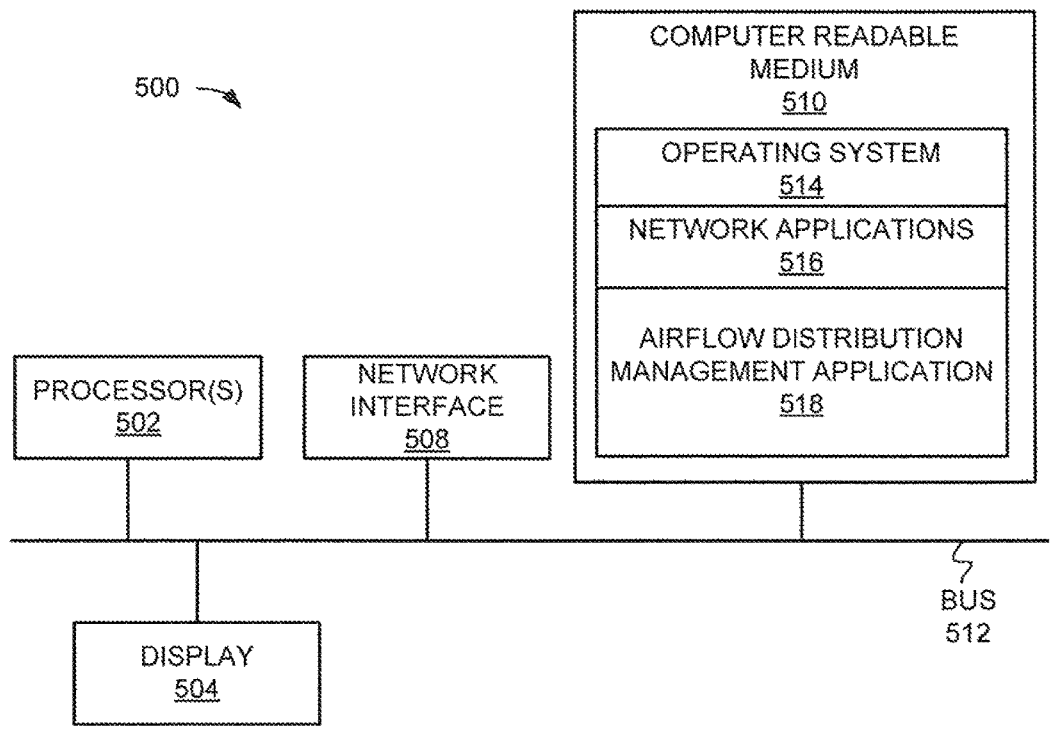
FIG. 5 illustrates a block diagram of a computing device to implement the methods depicted in FIGS. 3 and 4, according to an example of the present disclosure.

Turning now to FIG. 5, there is shown a block diagram of a computing device 500 to implement the methods depicted in FIGS. 3 and 4, in accordance with examples of the present disclosure. The device 500 includes a processor 502, such as a central processing unit; a display device 504, such as a monitor; a network interface 508, such as a Local Area Network LAN, a wireless 802.11x LAN, a 3G mobile WAN or a WiMax WAN; and a computer-readable medium 510. Each of these components is operatively coupled to a bus 512. For example, the bus 512 may be an EISA, a PCI, a USB, a FireWire, a NuBus, or a PDS.

The computer readable medium 510 may be any suitable non-transitory medium that participates in providing instructions to the processor 502 for execution. For example, the computer readable medium 510 may be non-volatile media, such as an optical or a magnetic disk; volatile media, such as memory; and transmission media, such as coaxial cables, copper wire, and fiber optics.

The computer-readable medium 510 may also store an operating system 514, such as Mac OS, MS Windows, Unix, or Linux; network applications 516; and an airflow distribution management application 518. The operating system 514 may be multi-user, multiprocessing, multitasking, multithreading, real-time and the like. The operating system 514 may also perform basic tasks such as recognizing input from input devices, such as a keyboard or a keypad; sending output to the display 504; keeping track of files and directories on the computer readable medium 510; controlling peripheral devices, such as disk drives, printers, image capture device; and managing traffic on the bus 512. The network applications 516 include various components for establishing and maintaining network connections, such as machine readable instructions for implementing communication protocols including TCP/IP, HTTP, Ethernet, USB, and FireWire.

The airflow distribution and provisioning management application 518 provides various components for managing airflow distribution and provisioning in an area, as described above. The management application 518 may thus comprise the controller 130 and/or the modules 204-216 of the management apparatus 202. In certain examples, some or all of the processes performed by the management application 518 may be integrated into the operating system 514. In certain examples, the processes may be at least partially implemented in digital electronic circuitry, or in computer hardware, machine readable instructions (including firmware and/or software), or in any combination thereof.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A method for managing airflow distribution through a plurality of adaptive vent tiles to cool equipment within an environment, said method comprising:
    accessing a model that correlates an environmental condition of the environment including the equipment with a setting arrangement of the plurality of adaptive vent tiles and operational settings of a plurality of fluid moving devices;
    calculating, by a processor, through implementation of the model, a setting arrangement of the adaptive vent tiles that results in a substantially optimized metric subject to a set of constraints, wherein the setting arrangement of the adaptive vent tiles comprises an arrangement in which adaptive vent tiles in respective groups of adaptive vent tiles have substantially uniform opening levels with respect to each other and specifies opening levels of the adaptive vent tiles; and
    setting opening levels of the adaptive vent tiles according to the specified opening levels of the calculated setting arrangement,
    wherein the model specifies a steady-state temperature of a heat dissipater based on a temperature change caused by factors other than by the fluid moving devices, the setting arrangement of the adaptive vent tiles, influences of each fluid moving device on the heat dissipater, a supply air temperature of each fluid moving device, a blower speed of each fluid moving device, and a number of the fluid moving devices.

2. The method according to claim 1, wherein the plurality of adaptive vent tiles are grouped into a first group and a second group, and wherein the calculated setting arrangement results in the adaptive vent tiles in the first group having opening levels that are substantially uniform with respect to each other and the adaptive vent tiles in the second group having opening levels that are substantially uniform with respect to each other.

3. The method according to claim 2, wherein the plurality of adaptive vent tiles that are located in a common cold aisle are grouped together.

4. The method according to claim 1, wherein calculating the setting arrangement of the plurality of adaptive vent tiles comprises calculating the setting arrangement of the plurality of adaptive vent tiles under steady-state conditions of an area in which airflow is supplied through the plurality of adaptive vent tiles.

5. The method according to claim 4, wherein the model comprises the following equation:

$$T_{ss} = \frac{\frac{C}{\tilde{U}} + \sum_{i=1}^{N_{FMD}} g_i \cdot SAT_i \cdot VFD_i}{\sum_{i=1}^{N_{FMD}} g_i \cdot VFD_i},$$

wherein $T_{ss}$ comprises a steady-state temperature of a heat dissipater, C denotes a temperature change caused by factors other than by a plurality of fluid moving devices, $\tilde{U}$ comprises a setting arrangement of the plurality of adaptive vent tiles, $g_i$ is a parameter that captures influences of each fluid moving device i on the heat dissipater, $SAT_i$ and $VFD_i$ are a supply air temperature and a blower speed of the ith fluid moving device, respectively, and $N_{FMD}$ denotes a total number of fluid moving devices.

6. The method according to claim 5, wherein $\tilde{U} = \sum_{j=1}^{N_{VTG}} d_j \cdot U_j + U_0$, and wherein $N_{VTG}$ is the total number of vent tile groups, $U_j$ is the substantially uniform adaptive vent tile opening of the $j^{th}$ adaptive vent tile group, $d_j$ is a parameter that captures the influence of each of the adaptive vent tile groups j, and $U_0$ quantifies the aggregated effects of all other vent tiles except the adaptive vent tiles.

7. The method according to claim 6, wherein calculating the setting arrangement of the plurality of adaptive vent tiles further comprises:
    for each of a plurality of adaptive vent tile setting arrangements $\tilde{U}$, evaluating a minimized cost function $J^*(\tilde{U})$ by solving the following equation:

$$J*(\overline{U}) = \text{minimize} J(\overline{VFD}, \overline{SAT}) = \left\{\sum_{l=1}^{N_{FMD}} VFD_l^2\right\} R_{VFD} + \left\{\sum_{l=1}^{N_{FMD}} (SAT_{max} - SAT_l)\right\} R_{SAT},$$

subject to the set of constraints, wherein $\overline{VFD} = [VFD_1 \ VFD_2 \ldots VFD_{N_{FMD}}]$, $\overline{SAT} = [SAT_1 \ SAT_2 \ldots SAT_{N_{FMD}}]$, $N_{FMD}$ denotes a total number of fluid moving devices i, $R_{VFD}$ and $R_{SAT}$ respectively are proper weightings for VFD power and chiller power, and $SAT_{max}$ is the maximum allowable supply air temperature of the fluid moving devices i.

8. The method according to claim 7, wherein the set of constraints comprises:

$$\overline{VFD}_{min} \leq \overline{VFD} \leq \overline{VFD}_{max},$$

$$\overline{SAT}_{min} \leq \overline{SAT} \leq \overline{SAT}_{max}, \text{ and}$$

$$T_{ss} \leq T_{ref},$$

wherein $T_{ref}$ is the temperature thresholds at all of the inlets of the plurality of racks of interest, $\overline{VFD}_{min}$ is the minimum allowable speeds of the VFDs in the fluid moving devices, and $\overline{SAT}_{min}$ is the minimum allowable supply air temperatures of the fluid moving devices; and wherein calculating the setting arrangement of the plurality of adaptive vent tiles further comprises:

determining a minimized cost function $J*(\overline{U})$ by solving the following equation:

minimize $J*(\overline{U})$, subject to $\overline{U}_{min} \leq \overline{U} \leq \overline{U}_{max},$ wherein $\overline{U}_{min}$ is the minimum allowable opening levels of the adaptive vent tiles and $\overline{U}_{max}$ is the maximum allowable opening levels of the adaptive vent tiles, and wherein the setting arrangement of the plurality of adaptive vent tiles that results in the substantially optimized metric comprises the setting arrangement ($\overline{U}$) corresponding to the minimized cost function $J*(\overline{U})$.

9. The method according to claim 1, further comprising: determining the operational settings for the plurality of fluid moving devices to comprise operational settings that minimize a cost function while the plurality of adaptive vent tiles are set according to the calculated setting arrangement of the plurality of adaptive vent tiles.

10. An apparatus for managing airflow distribution through a plurality of adaptive vent tiles to cool equipment within an environment, said apparatus comprising:

a memory storing machine readable instructions to:
calculate, through implementation of a model, a setting arrangement of a plurality of adaptive vent tiles that results in a substantially optimized metric subject to a set of constraints, wherein the setting arrangement of the plurality of adaptive vent tiles comprises an arrangement in which adaptive vent tiles in respective groups of adaptive vent tiles have substantially uniform opening levels with respect to each other and specifies opening levels of the adaptive vent tiles, wherein the model correlates an environmental condition of the environment including the equipment with a setting arrangement of the plurality of adaptive vent tiles and operational settings of the plurality of fluid moving devices; and set opening levels of the adaptive vent tiles according to the specified opening levels of the calculated setting arrangement; and a processor to implement the machine readable instructions, wherein the model specifies a steady-state temperature of a heat dissipater based on a temperature change caused by factors other than by the fluid moving devices, the setting arrangement of the adaptive vent tiles, influences of each fluid moving device on the heat dissipater, a supply air temperature of each fluid moving device, a blower speed of each fluid moving device, and a number of the fluid moving devices.

11. The apparatus according to claim 10, wherein the model comprises:

$$T_{ss} = \frac{\frac{C}{\tilde{U}} + \sum_{i=1}^{N_{FMD}} g_i \cdot SAT_i \cdot VFD_i}{\sum_{i=1}^{N_{FMD}} g_i \cdot VFD_i},$$

wherein $T_{ss}$ comprises a steady-state temperature of a heat dissipater, C denotes a temperature change caused by factors other than by a plurality of fluid moving devices, $g_i$ is a parameter that captures influences of each fluid moving device i, $SAT_i$ and $VFD_i$ are a supply air temperature and a blower speed of the ith fluid moving device, respectively, $N_{FMD}$ denotes a total number of fluid moving devices, and wherein $\tilde{U} = \sum_{j=1}^{N_{VTG}} d_j \cdot U_j + U_0,$ wherein $N_{VTG}$ is the total number of vent tile groups, $U_j$ is the substantially uniform adaptive vent tile opening of the $j^{th}$ adaptive vent tile group, $d_j$ is a parameter that captures the influence of each of the adaptive vent tile groups j, and $U_0$ quantifies the aggregated effects of all other vent tiles except the adaptive vent tiles.

12. The apparatus according to claim 11, wherein the machine readable instructions are to calculate the setting arrangement of the plurality of adaptive vent tiles through, for each of a plurality of adaptive vent tile setting arrangements $\overline{U}$, an evaluation of a minimized cost function $J*(\overline{U})$ by solving the following equation:

$$J*(\overline{U}) = \text{minimize} J(\overline{VFD}, \overline{SAT}) =$$

$$\left\{\sum_{i=1}^{N_{FMD}} VFD_i^3\right\} R_{VFD} + \left\{\sum_{i=1}^{N_{FMD}} (SAT_{max} - SAT_i)\right\} R_{SAT},$$

subject to the set of constraints, wherein $\overline{VFD} = [VFD_1 \ VFD_2 \ \ldots \ VFD_{N_{FMD}}]$, $\overline{SAT} = [SAT_1 \ SAT_2 \ \ldots \ SAT_{N_{FMD}}]$, $N_{FMD}$ denotes a total number of fluid moving devices i, $R_{VFD}$ and $R_{SAT}$ respectively are proper weightings for VFD power and chiller power, and $SAT_{max}$ is the maximum allowable supply air temperature of the fluid moving devices i.

13. The apparatus according to claim 12, wherein the set of constraints comprises:

$$\overline{VFD}_{min} \leq \overline{VFD} \leq \overline{VFD}_{max},$$

$$\overline{SAT}_{min} \leq \overline{SAT} \leq \overline{SAT}_{max}, \text{ and}$$

$$T_{ss} \leq T_{ref},$$

wherein $T_{ref}$ is the temperature thresholds at all of the inlets of the plurality of racks of interest, $\overline{VFD}_{min}$ is the minimum allowable speeds of the VFDs in the fluid moving devices, and $\overline{SAT}_{min}$ is the minimum allowable supply air temperatures of the fluid moving devices; and wherein machine readable instructions are to calculate the setting arrangement of the plurality of adaptive vent tiles through a determination of a minimized cost function $J*(\overline{U})$ by solving the following equation:

minimize $J*(\overline{U})$, subject to $\overline{U}_{min} \leq \overline{U} \leq \overline{U}_{max},$ wherein $\overline{U}_{min}$ is the minimum allowable opening levels of the adaptive vent tiles and $\overline{U}_{max}$ is the maximum allowable opening levels of the adaptive vent tiles, and wherein the setting arrangement of the plurality of adaptive vent tiles that results in the substantially optimized metric comprises the setting arrangement ($\overline{U}$) corresponding to the minimized cost function $J^*(\overline{U})$.

14. The apparatus according to claim 10, further comprising machine readable instructions to:

determine the operational settings for the plurality of fluid moving devices to be the operational settings that minimize a cost function while the plurality of adaptive vent tiles are set according to the calculated setting arrangement of the plurality of adaptive vent tiles.

15. A non-transitory computer readable storage medium on which is stored machine readable instructions that when executed by a processor implement a method for managing airflow distribution through a plurality of adaptive vent tiles to cool equipment within an environment, said machine readable instructions comprising code to:

calculate, through implementation of a model, a setting arrangement of a plurality of adaptive vent tiles that results in a substantially optimized metric subject to a set of constraints, wherein the setting arrangement of the plurality of adaptive vent tiles comprises an arrangement in which adaptive vent tiles in respective groups of adaptive vent tiles have substantially uniform opening levels with respect to each other and specifies opening levels of the adaptive vent tiles, wherein the model correlates an environmental condition of the environment including the equipment with a setting arrangement of the plurality of adaptive vent tiles and operational settings of the plurality of fluid moving devices; and set opening levels of the adaptive vent tiles according to the specified opening levels of the calculated setting arrangement, wherein the model specifies a steady-state temperature of the heat dissipater based on a ratio of a numerator to a denominator, wherein the numerator is based on a temperature change caused by factors other than by the fluid moving devices and the setting arrangement of the adaptive vent tiles.

16. The non-transitory computer readable storage medium according to claim 15, wherein the numerator is based on the temperature change caused by the factors other than by the fluid moving devices divided by the setting arrangement of the adaptive vent tiles.

17. The non-transitory computer readable storage medium according to claim 15, wherein the numerator is further based on influences of each fluid moving device on the heat dissipater, a supply air temperature of each fluid moving device, a blower speed of each fluid moving device, and a number of the fluid moving devices.

18. The non-transitory computer readable storage medium according to claim 17, wherein the denominator is based on the influences of each fluid moving device on the heat dissipater, the blower speed of each fluid moving device, and the number of the fluid moving devices.

* * * * *